United States Patent
Patel et al.

(10) Patent No.: US 12,425,682 B2
(45) Date of Patent: *Sep. 23, 2025

(54) MULTIMEDIA STREAMING DEVICE

(71) Applicant: Amazon Technologies, Inc., Seattle, WA (US)

(72) Inventors: Jiger Patel, San Jose, CA (US); Lynette Marie Ross, Mountain View, CA (US); Vaidyanathan Manish, San Jose, CA (US); Emilio Molina Reyes, San Jose, CA (US); Troy Herndon, San Jose, CA (US); Michael Christopher Kouxommone, Mountain View, CA (US); Dipika Rajale, Milpitas, CA (US); Yiran Tang, San Jose, CA (US); Angel Wilfredo Martinez, Aptos, CA (US)

(73) Assignee: Amazon Technologies, Inc., Seattle, WA (US)

( * ) Notice: Subject to any disclaimer, the term of this patent is extended or adjusted under 35 U.S.C. 154(b) by 608 days.

This patent is subject to a terminal disclaimer.

(21) Appl. No.: 17/850,555

(22) Filed: Jun. 27, 2022

(65) Prior Publication Data

US 2024/0098329 A1    Mar. 21, 2024

(51) Int. Cl.
| | |
|---|---|
| *H04N 21/436* | (2011.01) |
| *F21V 7/00* | (2006.01) |
| *F21V 33/00* | (2006.01) |
| *H04N 21/422* | (2011.01) |
| *H04N 21/4363* | (2011.01) |
| *H04R 1/02* | (2006.01) |
| *H05K 1/02* | (2006.01) |
| *H05K 7/14* | (2006.01) |
| *H05K 7/20* | (2006.01) |

(52) U.S. Cl.
CPC ..... *H04N 21/43635* (2013.01); *F21V 7/0008* (2013.01); *F21V 33/0056* (2013.01); *H04N 21/42203* (2013.01); *H04R 1/02* (2013.01); *H05K 1/0243* (2013.01); *H05K 7/1427* (2013.01); *H05K 7/2039* (2013.01)

(58) Field of Classification Search
None
See application file for complete search history.

(56) References Cited

U.S. PATENT DOCUMENTS

2019/0394547 A1    12/2019    Lemons et al.

FOREIGN PATENT DOCUMENTS

WO        2019040307 A1    2/2019

OTHER PUBLICATIONS

WO App. No. PCT/US2023/025185, "International Search Report and Written Opinion," mailed Sep. 28, 2023, 15 pages.

*Primary Examiner* — Samira Monshi
(74) *Attorney, Agent, or Firm* — Kilpatrick Townsend & Stockton LLP

(57) ABSTRACT

A multimedia streaming device can include a first circuit board configured to provide user controls and a second circuit board electrically coupled with the first circuit board and configured to provide content processing. The multimedia streaming device can also include a heat sink positioned between the first circuit board and the second circuit board and defining a speaker enclosure that includes a first portion in contact with the first circuit board, a second portion in contact with the second circuit board, and a third portion. The multimedia streaming device can additionally include a speaker installed in the third portion of the speaker enclosure.

20 Claims, 12 Drawing Sheets

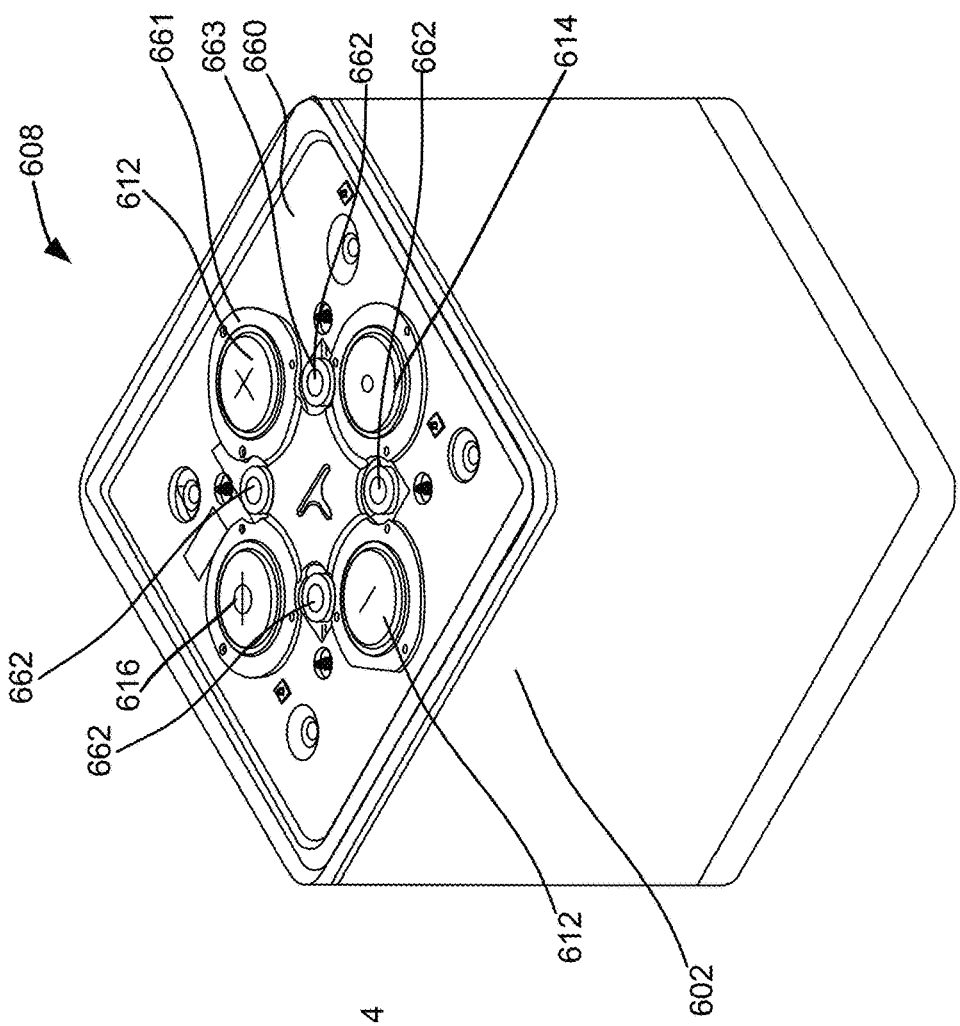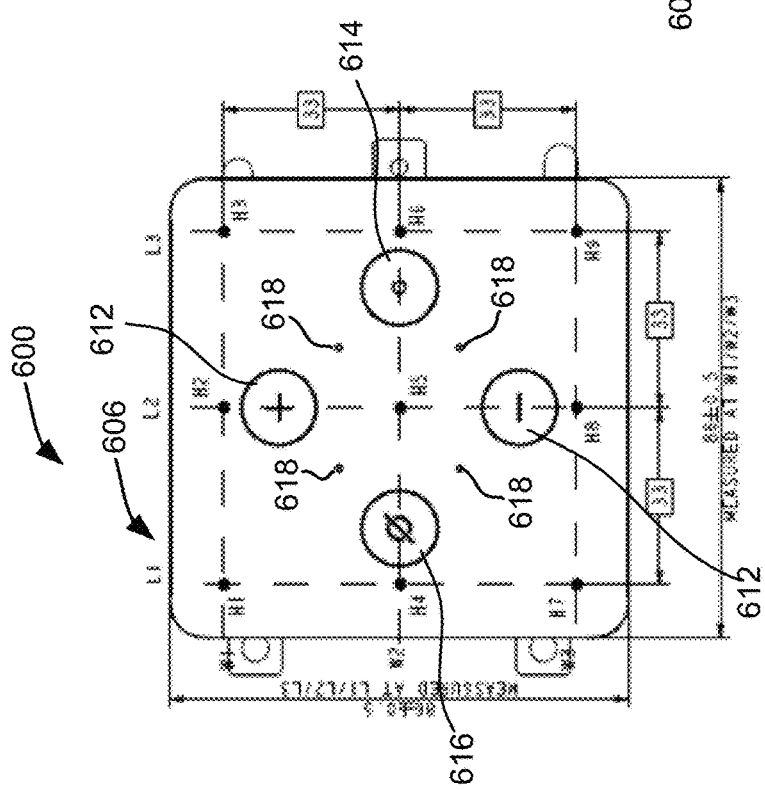
FIG. 6

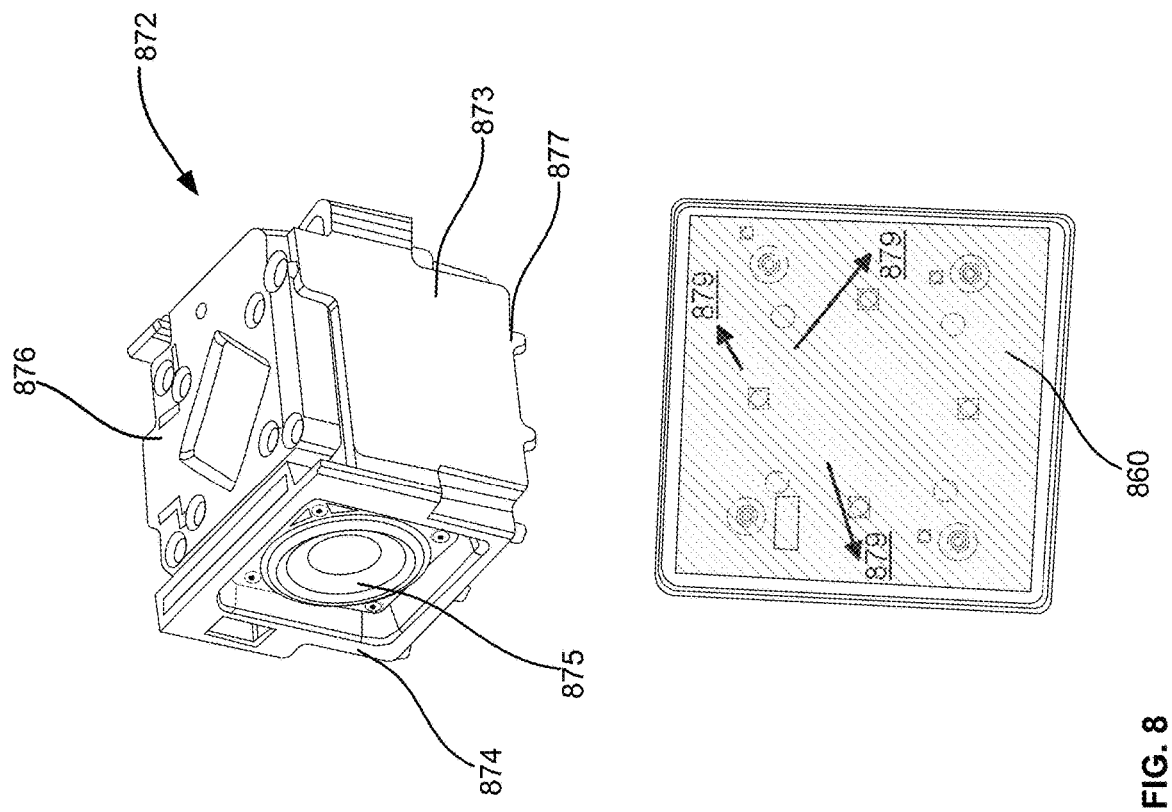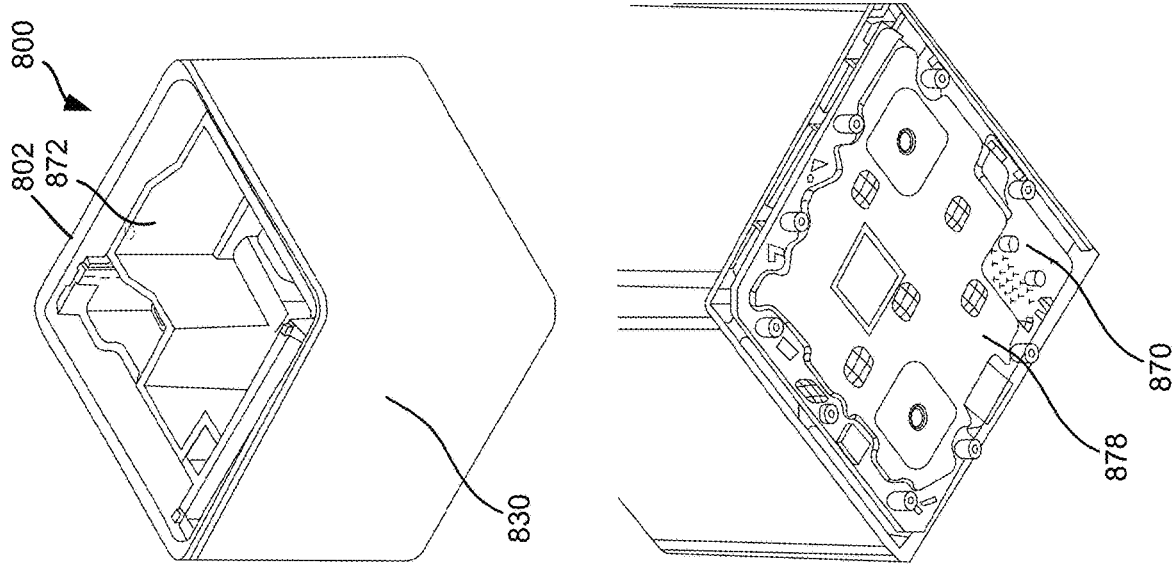
FIG. 8

MULTIMEDIA STREAMING DEVICE

BACKGROUND

As voice recognition technology improves, systems that employ such technology continue to proliferate. Some systems employ what is referred to as near-field voice recognition where a user speaks into a microphone located on a handheld device, such as a remote control or mobile device. Other systems employ far-field voice recognition where a user can speak to a device while the user is within the general vicinity of the device, e.g., within the same room, but not necessarily in close proximity to or even facing the device. Both far-field devices and near-field devices can be used to request content to be played on an audio and/or video system.

BRIEF DESCRIPTION OF THE DRAWINGS

Various embodiments in accordance with the present disclosure will be described with reference to the drawings, in which:

FIG. 6 illustrates views of a top portion of a multimedia streaming device according to some embodiments;

FIG. 8 illustrates views of a heat sink of a multimedia streaming device according to some embodiments;

DETAILED DESCRIPTION

Figure 1:
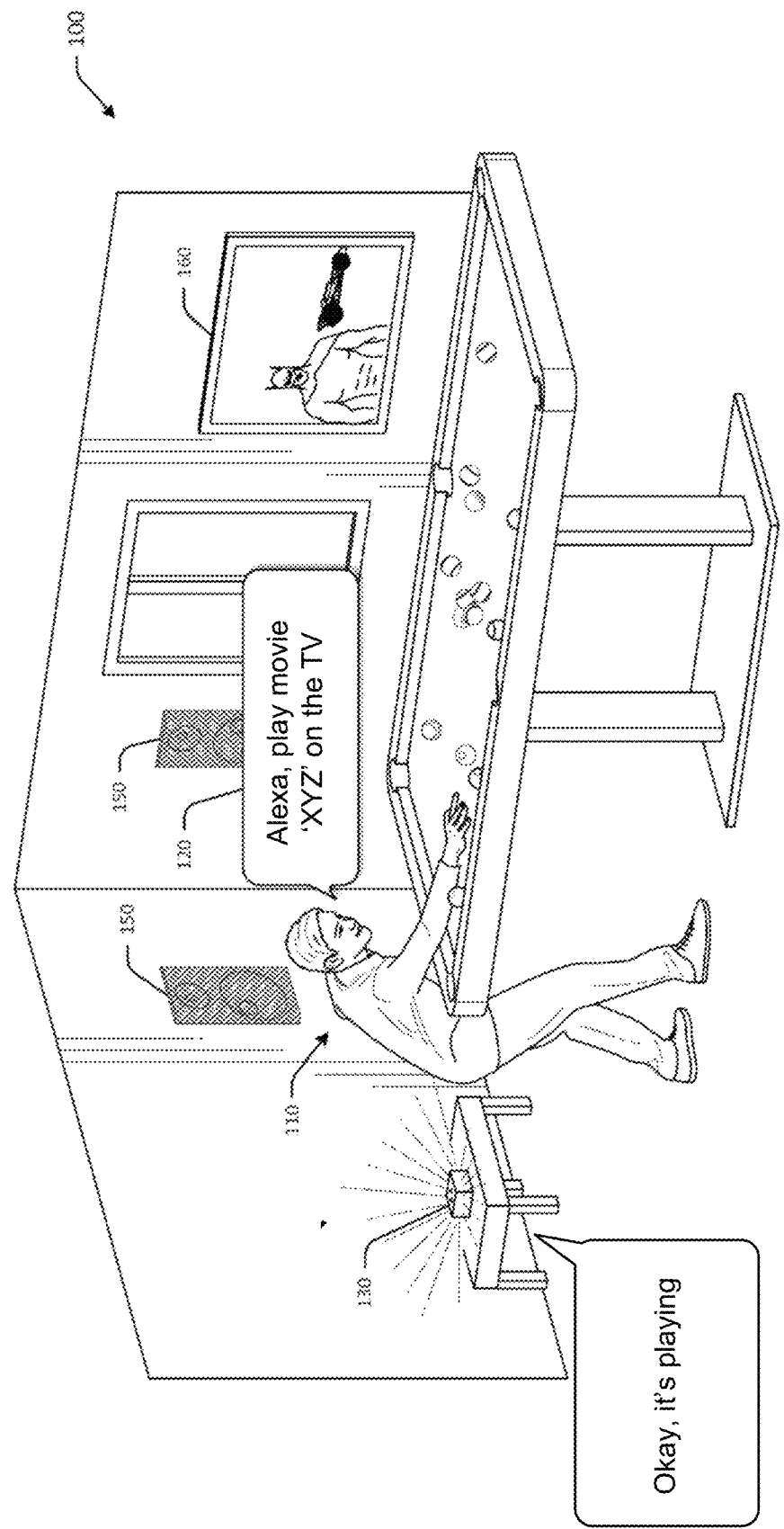
FIG. 1 shows an example use case and schematic drawing of a multimedia streaming device in accordance with one or more embodiments of the disclosure.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

Embodiments of this disclosure relates to, among other things, systems and methods for multimedia streaming devices. Embodiments include devices that can be voice-controlled and respond to audible instructions. In response to the audible instructions, a multimedia streaming device can output digital content for presentation at an internal speaker of the multimedia streaming device or at another external device, e.g., at a user's television or one or more external speakers connected to the multimedia streaming device. The multimedia streaming device can include a first circuit board for providing user controls (e.g., volume controls, action controls, microphones and audio front end processing, etc.) and a second circuit board that is electrically coupled with the first circuit board for providing content processing. The multimedia streaming device can include a heat sink positioned between and in contact with the first circuit board and the second circuit board. The heat sink defines a speaker enclosure that a speaker of the multimedia streaming device can be installed within. Content processing of audio to be played by the multimedia device can be output using the speaker. The multimedia device can also include a number of ports, such as one or more audio/video ports that are mounted to the second circuit board and are encased by the heat sink. Content processing of audio, video, and/or other content type to be played by a remote device (e.g., a television, a sound system, etc.) can be send to the remote device via at least one of the ports.

To illustrate, consider a set-top box configured to receive voice commands and cause content to be output at a television in response to the voice commands. A set of microphones of the set-top box receives a natural language utterance requesting a movie to be played (e., "Alexa, play movie XYZ"). Upon receiving the natural language utterance, a first circuit board of the set-top box on which the set of microphones is installed can process the natural language utterance to detect a wakeword (e.g., "Alexa") and generate audio data representative of the natural language utterance. Natural language processing can be performed on the audio data locally on the set-top box, remotely on a server, or distributedly between the set-top box and the remote server. As a result, an intent to play a movie and title of the movie are identified. The set-top box may emit a light at one side while providing a response to the natural language utterance. In addition, the set-top box receives content data via a radio frequency (RF) receive chain installed on the first circuit board (e.g., a WiFi connectivity chip) and sends this content data to a second circuit board of the set-top box. The second circuit board further processes the content data (e.g., by applying a particular codec to the content data, generating a playlist, etc.), detects that the television is connected to the set-top box via an active high-definition multimedia interface (HDMI) port, and sends the processed content data to the television via the HDMI port. A heat sink of the set-top box dissipates heat generated by the second circuit board, where this heat is generated due at least in part to the content data processing. The heat sink can define a speaker enclosure where a speaker of the set-top box is installed. The speaker can output data indicating that the requested movie is about to play and/or audio data of the movie. A top side of the heat sink can be in contact with the first circuit board. Given that the first circuit board includes an RF receive chain, in order to reduce RF interference and/or to increase RF shielding, the top side can be made out of non-conductive electrical material, such as plastic, and can have a certain thickness. The HDMI port, along other ports, can be installed on the second circuit board and secured in place by a wall of the heat sink.

Embodiments of the present disclosure provide several technical advantages over conventional multimedia streaming devices. For instance, the multimedia streaming device can control a user's electronic devices, e.g., televisions and audio video systems, for presenting the digital content in accordance with a user's request. As a result, embodiments of the multimedia streaming device may be configured to control multiple electronic devices in an ambient environment without having to be manipulated or pointed at the respective devices and may be configured to react to voice-based instructions, thereby reducing or removing a need for users to physically manipulate the device as is the case with a conventional device. Further, by using a heat sink configured as also a speaker enclosure, a particular form factor of the multimedia media device becomes possible, while retaining or improving the overall multimedia streaming functionalities including content input and output.

FIG. 1 shows an example use case 100 and schematic drawing of multimedia streaming device 130 in accordance with one or more embodiments of the disclosure. A user 110 may be in an ambient environment with a number of electronic devices, such as an audio system 150, a television 160, and other electronic devices configured to be controlled remotely. A multimedia streaming device 130 may be in the ambient environment of the user 110, such as on a table, in a cabinet, or elsewhere in the ambient environment.

The user 110 may verbally interact with the multimedia streaming device 130 to request content from the multimedia streaming device, which itself can be connected to one or more digital content sources, e.g., to one or more audio content sources and/or video content sources via a wide area network and/or a local area network. For example, the user 110 may utter a natural language phrase 120 (also referred to herein as a user utterance or speech input) that includes an instruction, command, or request, such as "Alexa, play movie 'XYZ' on the TV."

The multimedia streaming device 130 may detect the speech input from the user 110 and may determine a meaning of the phrase 120. For example, the multimedia streaming device 130 may detect a trigger word or a wake-word of "Alexa," or another trigger word, and may subsequently begin monitoring for voice commands using one or more microphones. In some embodiments, detection and/or processing of the speech input may be done locally at the multimedia streaming device 130, while in other embodiments the multimedia streaming device 130 may communicate with one or more remote server computers to determine whether the speech input includes one or more voice commands. In some embodiments, the trigger word may be detected and determined locally, while the full speech input including potential voice commands may be processed remotely. In other embodiments, the full speech input can be processed entirely locally or using any combination of local and/or remote speech processing services.

After determining or receiving the meaning of the phrase 120 in the example of FIG. 1, the multimedia streaming device 130 may initiate one or more response actions to control the television 160 and the audio system 150. In this example, the multimedia streaming device 130 may determine that the user 110 wants to watch a movie on television 160. In response to this determination, the multimedia streaming device 130 may then detect the state of the external audio/video (AV) system to determine whether or not any open audio channels are available (e.g., any external device that is powered on and possesses a speaker that can transmit audio, such as the internal speaker of television 160 or the speakers of the audio system 150). In some instances, if the multimedia streaming device 130 detects that there are no open audio channels on the external devices, the multimedia streaming device may present the audio content locally, using an internal speaker of the multimedia streaming device 130. In some instances, if the multimedia streaming device 130 detects that the television 160 does include an open audio channel (e.g., the television 160 is in the ON state and not muted), the multimedia streaming device 130 can send a control signal to switch the AV input of the television 160 and may present the video content on the television 160. In some instances, if the multimedia streaming device 130 detects that the television 160 is in the OFF state, the multimedia streaming device 130 can initiate a control sequence that can first turn on the television 160 and then set the television AV input to the input associated with the multimedia streaming device 130. Next the multimedia streaming device 130 can stream the video content to the screen of the television 160 (e.g., via an HDMI port or the like).

Figure 2:
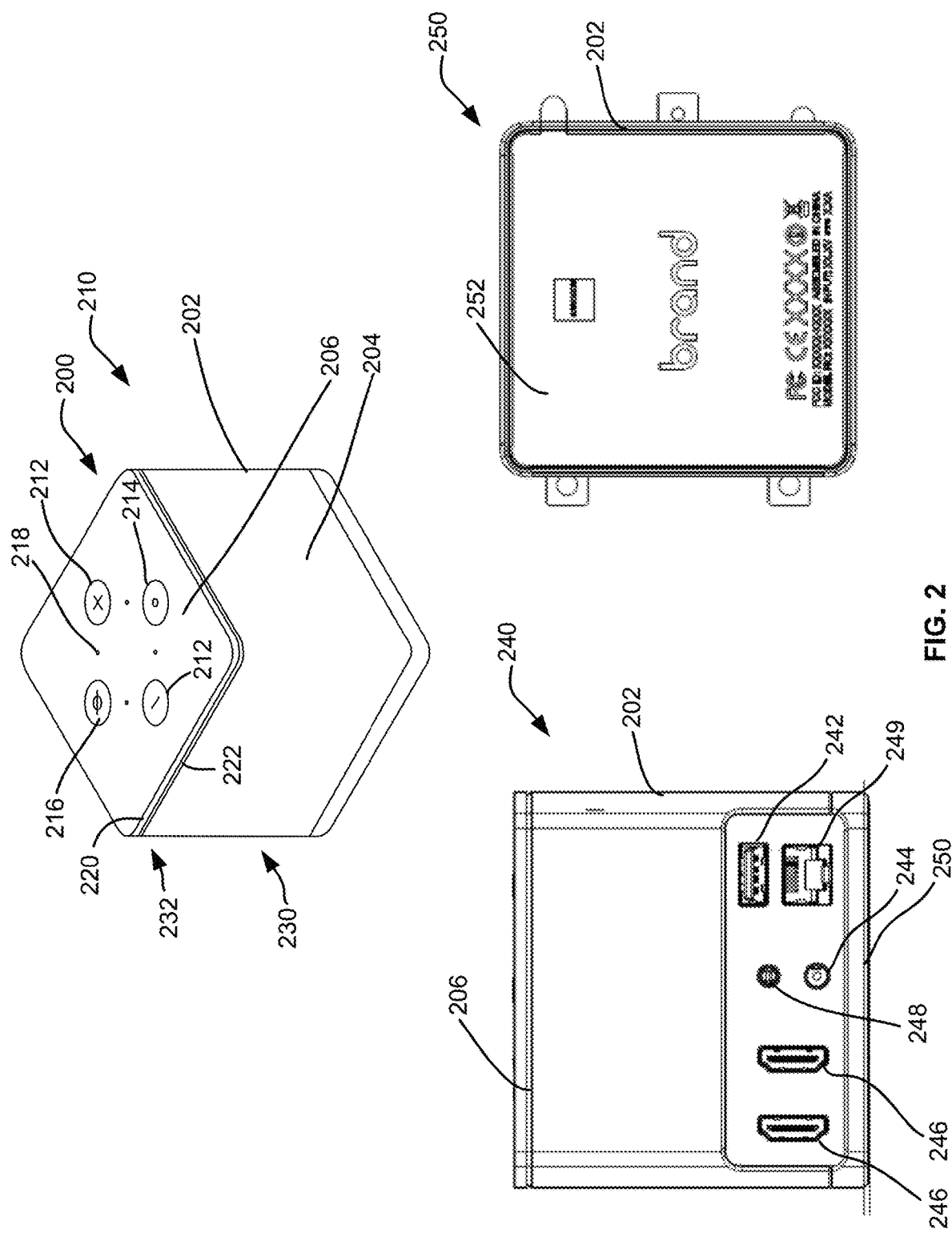
FIG. 2 schematically depicts a multimedia streaming device in various views in accordance with one or more embodiments of the present disclosure.
Figure 10:
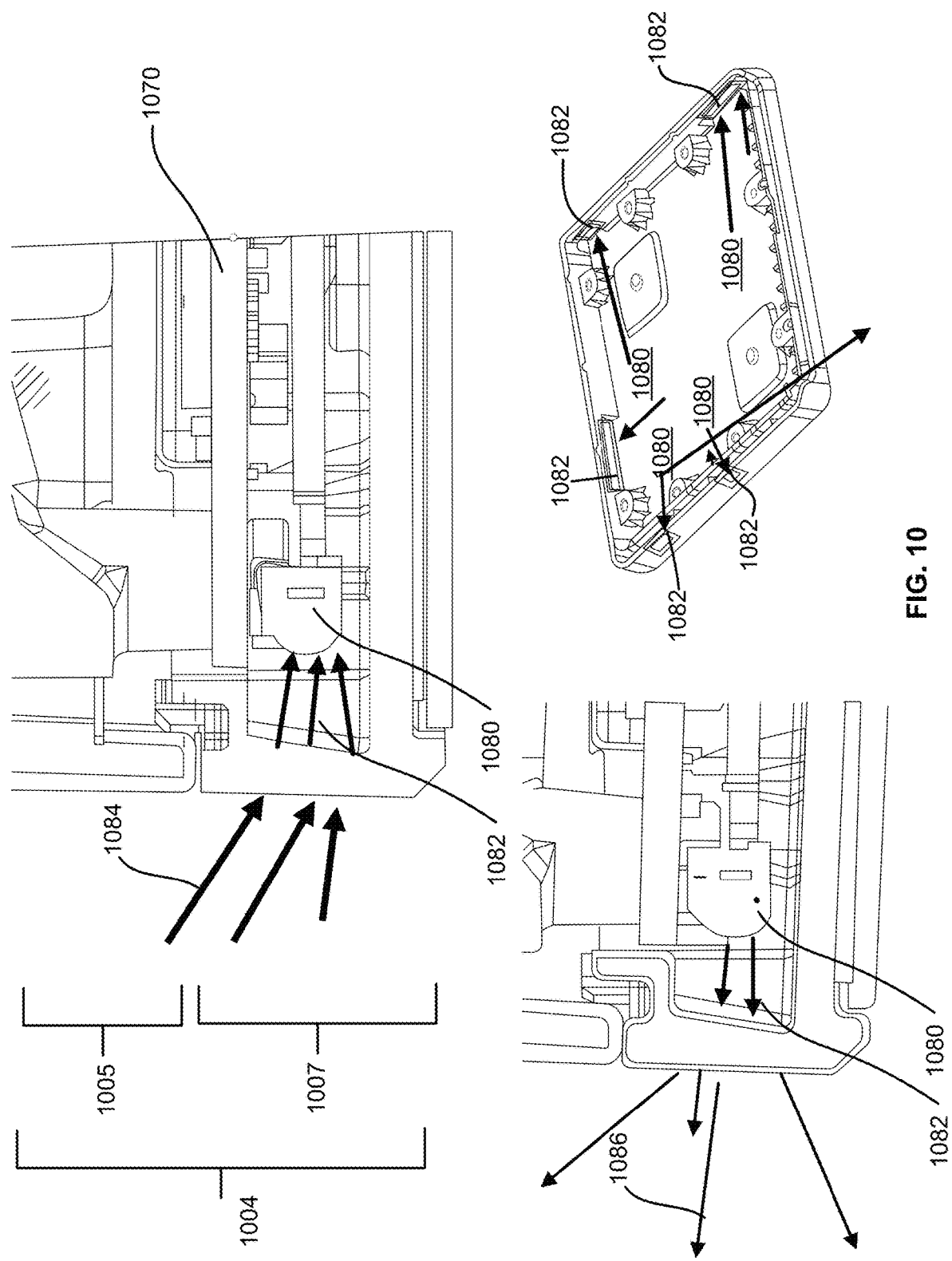
FIG. 10 illustrates an example of infrared transmission of a multimedia streaming device according to some embodiments.
Figure 12:
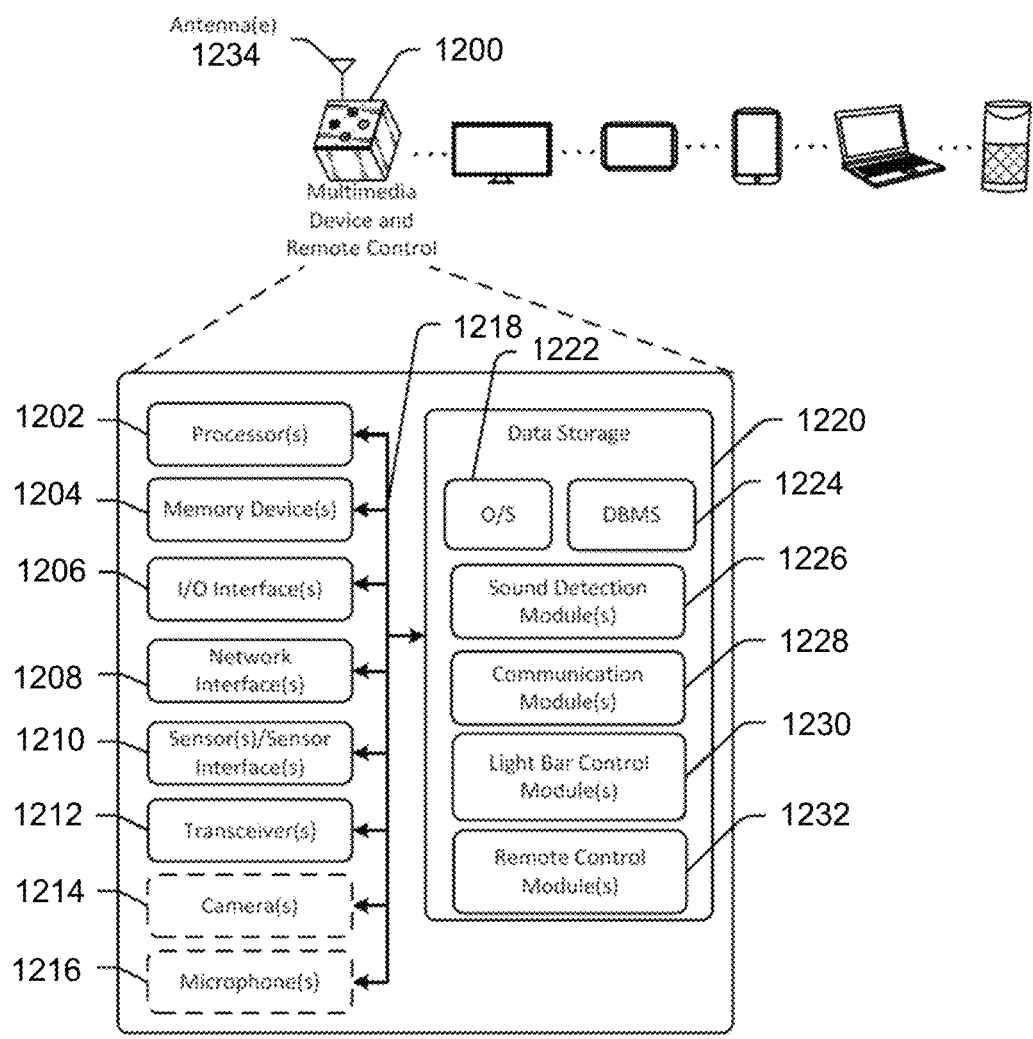
FIG. 12 is a schematic block diagram of one or more illustrative multimedia streaming devices in accordance with one or more embodiments of the disclosure.

To implement the response actions, the multimedia streaming device 130 can send one or more commands or instructions via an AV interface, e.g., HDMI or the like or may use a wireless channel, e.g., an infrared (IR) optical channel, similar to a universal remote control device. Accordingly, the multimedia streaming device 130 may include a housing with a number of sidewalls, one or more AV output port(s) accessible through one or more of the sidewalls, and a set of one or more IR LEDs that are configured to emit infrared light through one or more of the sidewalls. For example, FIGS. 2, 10, and 12 show examples of a multimedia streaming device that includes infrared (IR) light emitting diodes (LEDs). In some embodiments, the infrared light can be emitted three hundred sixty degrees about the multimedia streaming device 130 so as to provide infrared coverage of a relatively large portion of the ambient environment. In some embodiments, the multimedia streaming device 130 may include IR LEDs oriented or positioned in opposite directions, so as to increase infrared LED coverage of the ambient environment.

The multimedia streaming device 130 may also include one or more AV interface ports, such as one or more of a video graphics array (VGA) port, a digital visual interface (DVI) port, and/or a HDMI port configured to output video content, e.g., standard resolution content, high-definition content, ultra-high-definition digital content, and/or any other resolution (e.g., 4K resolution, Ultra High Definition (UHD) resolution, etc.). The multimedia streaming device 130 may be connected to the television 160 wirelessly or via at least one of the AV ports and may cause streaming of the requested content with visual presentation of the content at the television 160.

FIG. 2 schematically depicts a multimedia streaming device 200 in various views in accordance with one or more embodiments of the disclosure. As illustrated in perspective view 210, the multimedia streaming device 200 may have a box-like housing 202 (e.g, having a substantially cubic shape with rounder corners). Specifically, the housing 202 may have a number of sidewalls 204 that form sides of the device, as well as walls forming a top surface 206 and a bottom surface 250. Each of the sidewalls, top surface 206, and bottom surface 250 can be substantially rectangular (or square). For instance, the sidewalls 204 may have a height of seventy-seven mm and width of eighty-six mm. The top surface 206 and the bottom surface 250 may have a length and width of eighty-six mm. The multimedia streaming device 200 may include a set of IR LEDs that are configured to emit IR light through each of the sidewalls, and in some embodiments, through the top and bottom surfaces, of the housing 202. Other embodiments may have different form factors.

The top surface 206 of the multimedia streaming device 200 may include one or more physical controls, such as buttons, switches, and other control devices. For example, the multimedia streaming device 200 may include volume control buttons 212 that control a speaker volume of the multimedia streaming device 200 or of a connected device. The multimedia streaming device 200 may include an action button 214 (e.g., to turn the power ON or OFF), a mute button or a privacy button 216, and other buttons. The multimedia streaming device 200 may include an ambient light sensor. For instance, the ambient light sensor may be installed near the top surface 206, such as being positioned under the privacy button 216. The ambient light sensor can generate measurement data indicating ambient light in the environment surrounding the multimedia streaming device and the measurement data can be used to control output properties of a light waveguide 220. For instance, the measurement data may be used to control a brightness or intensity of light emitted by the light waveguide 220. The processing of such measurement data and the control of the output properties can be implemented on circuitry included in a circuit board (e.g., first circuit board 360 in FIG. 3) on which the ambient light sensor may be installed. In some embodiments, the multimedia streaming device 200 may include a display or other component.

The multimedia streaming device 200 may include one or more microphone holes 218 that can be used to facilitate detection of ambient sound by one or more microphones positioned within the housing 202. For instance, there may be four microphone holes 218, each corresponding to one microphone, although a different number of microphone holes 218 is possible.

The multimedia streaming device 200 may include a light waveguide 220. The light waveguide 220 may include an optically clear or colored elongated component 222 positioned under the top surface 206 through which light from one or more LEDs may be visible. The light waveguide 220 may be positioned at a front side 230 of the multimedia streaming device 200. The front side 230 can be a sidewall of the multimedia streaming device 200. In some embodiments, such as the illustrated embodiment, the light waveguide 220 may be linear or straight and may be positioned along an edge 232 of the housing 202. The elongated component 222 may therefore be attached to, or integrated into, the housing 202 and may form an edge of the housing 202. The light waveguide 220 may be configured to indicate that sound is detected by the multimedia streaming device 200, that the multimedia streaming device 200 may be outputting data (e.g., response data to a detected user input), a status of the multimedia streaming device 200 (e.g., being muted, being configured to connect to a local area network), and/or a status of a user account associated with the multimedia streaming device 200 (e.g., a notification related to the user account). For example, if a microphone of the multimedia streaming device 200 detects sound or voice coming from a left side of the multimedia streaming device 200, one or more LEDs on the left side of the multimedia streaming device 200 may be caused to illuminate, so as to indicate to a user that sound is being detected from the left side of the multimedia streaming device 200. The light waveguide 220 may dynamically modify LEDs that are illuminated while sound or voice is detected, and may also be used to visually communicate information to a user. For example, during processing, the light waveguide 220 may have a certain illumination status, while the device is muted, the light waveguide 220 may have a different illumination status, and so forth. The light waveguide 220 may be a straight or linear light waveguide and may be visible to users.

In some embodiments, the light waveguide 220 may be positioned elsewhere, along different edges or surfaces, and can be positioned diagonally or in another orientation respective to the housing of the device. In an example, the light waveguide 220 extends only between ends of the front side 230. In this example, material similar to or the same as from which the light waveguide 220 is made is used to define a non-light emitting surface that has a similar external shape and geometry as the light waveguide 220. This non-light emitting surface can extend around and under the remaining perimeter of the top surface 206. In this way, both the light waveguide and the non-light emitting surface can give the impression of one continuous material that extends around and under the top surface 206, whereas only light can be outwardly emitted only from the front side 230. In another example, the light waveguide 220 extends around and under the top surface 206. In this example LEDs may be located near the front side 230 only such that light emitted from the LEDs is transmitted outwardly only from the front side 230. Other configurations are possible, such that light can be emitted from the front side 230 only, from all sides, or from multiple but not all sides of the multimedia streaming device 200. For instance, with the light waveguide 220 extending around and under the top surface 206, LEDs may be located near the front side 230 and one or more additional sides such that light emitted from the LEDs is transmitted outwardly from the front side 230 and the one or more additional sides.

A rear side 240 of the multimedia streaming device 200 is illustrated in FIG. 2. The rear side 240 is a sidewall of the multimedia streaming device 200 that is opposite the front side 230. The rear side 240 of the multimedia streaming device 200 may include one or more AV ports, connectors, inputs, outputs, and the like. For example, the rear side 240 may include a Universal Serial Bus (USB) port 242 (or a micro USB input), a power input jack 244, one or more HDMI ports 246 configured to output high definition video and audio, an external infrared light blaster connection port 248 (e.g., infrared light sensor input or output jack, etc.), an Ethernet port 249, and the like. In some embodiments, the multimedia streaming device 200 may include a rechargeable battery.

The bottom surface 250 of the multimedia streaming device 200 may be formed by a bottom wall 252 and may include components such as rubber feet, nonslip material, and other components to support the device.

Figure 3:
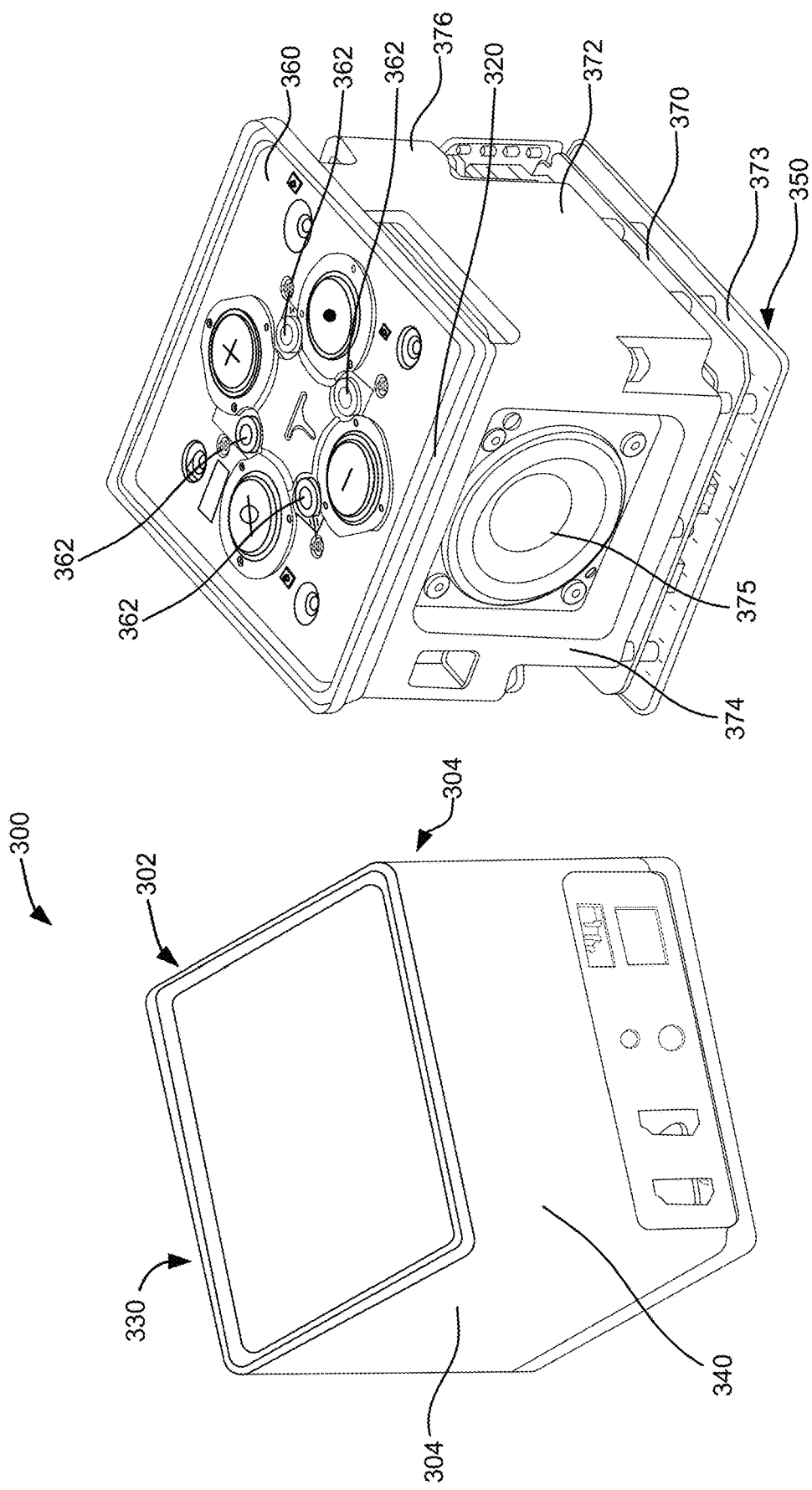
FIG. 3 shows another view of a multimedia streaming device in accordance with one or more embodiments of the disclosure.

FIG. 3 shows another view of a multimedia streaming device 300 according to certain embodiments. The multimedia streaming device includes a housing 302 with sidewalls, such as sidewalls 304, front side 330, and rear side 340. An internal component assembly 308, including the light waveguide 320, may be positioned on or in the housing 302.

In an example, the internal component assembly 308 includes a first circuit board 360, a second circuit board 370, and a heat sink 372. On the first circuit board 360, microphone and control circuitry can be mounted and include one or more microphones and one or more control buttons for providing user control. For example, four microphones 362 may be installed on the first circuit board 360. A first microphone of the microphones 362 may be angled in a first direction. A second microphone of the microphones 362 may be angled in a second direction. A third microphone of the microphones 362 may be angled in the first direction or a third direction, and a fourth microphone of the microphones 362 may be angled in the second direction or a fourth direction. The set of microphones may include fewer or more than four microphones and the set of microphones may be arranged in an array or in a different arrangement. The set of microphones may be used to detect sound and generate an audio signal, and to detect a location of sound that is captured by any of the microphones. Although not shown in FIG. 3, other components can be mounted to the first circuit board 360, such as one or more WiFi connectivity chips, one or more Bluetooth connectivity chips, and/or other RF components.

The first circuit board 360 is communicatively coupled, via one or more signal lines (e.g., a flat flexible electrical band), with the second circuit board 370, which can provide content processing. For instance, the second circuit board 370 may include one or more processors and one or more memories for performing various operations related to content processing. As an example, the second circuit board 370 can receive, process, and send multimedia content data to a television coupled with the multimedia streaming device 300 via at least one port of a set of ports 390 of the multimedia streaming device 300. The heat sink 372 is positioned between the first circuit board 360 and the second circuit board 370 and dissipates heat from the first circuit board 360 and/or the second circuit board 370. The heat sink 372 defines a speaker enclosure that is in contact with both the first circuit board 360 and the second circuit board 370. The heat sink 372 can have a box-like shape similar to the housing 302 with sidewalls. Additional components of the multimedia streaming device 300 can be positioned with respect to the sidewalls of the heat sink 372. For instance, a speaker 375 can be positioned in a first sidewall 374 of the heat sink 372 and the ports 390 can be installed on the second circuit board 370 under a second sidewall 376 that is opposite to the first sidewall 374. The speaker 375 can be installed near and facing the front side 330, whereas the ports 390 can be installed near and facing the rear side 340.

In an example, the multimedia streaming device 300 can also include a heat spreader installed on an inside part 373 of a bottom surface 350 of the housing 302. The heat spreader can allow for an even distribution of heat across the bottom of the multimedia streaming device 300. The heat spreader may be a tape-like material or a coating material, such as a graphite material, or any other suitable material.

Figure 4:
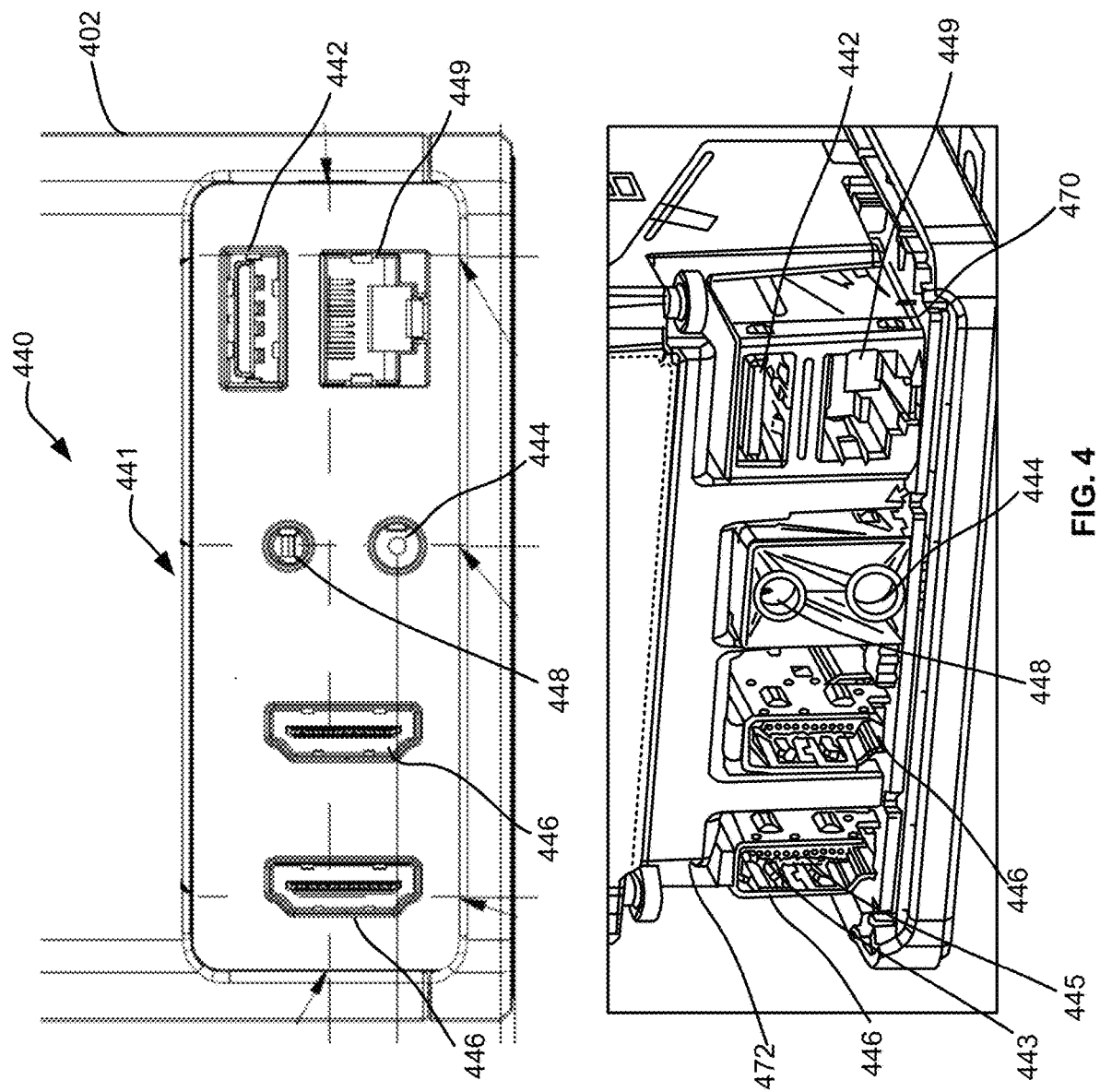
FIG. 4 schematically shows a rear side of a multimedia streaming device according to some embodiments.

FIG. 4 schematically shows a rear side 440 of a multimedia streaming device according to some embodiments. The rear side 440 is one side of a housing 402 of the multimedia streaming device. The rear side 440 includes ports 441, which may be positioned within the housing 402 and outside of a heat sink (e.g., heat sink 372 in FIG. 3). The ports 441 are installed on a circuit board 470, which is an example of the second circuit board 370 in FIG. 3. The ports 441 can be secured by the heat sink 472 (e.g., by edges of a sidewall of the heat sink 472).

In an example, the ports 441 may include AV ports and a connector that includes at least two stacked input and/or output ports. For example, the rear side 440 may include AV ports that are HDMI ports 446 and installed in a vertical orientation on the circuit board 470. The HDMI ports 446 may be made of stainless steel, or another suitable metal material, and can include pins. In an example, the ports 441 include multiple HDMI ports 446. In this example, at least one of the HDMI ports 446 can be an input port, and at least another one of the HDMI ports 446 can be an output port.

To achieve satisfactory signal integrity, pins that are closer to the circuit board 470 may be shorter in length than pins that are farther from the circuit board 470. For instance, pin 443 is illustrated as being farther from the circuit board 470 than pin 445, so pin 443 ca be longer in length than pin 445. To protect against momentum when an AV plug (e.g., an HDMI plug) is removed from one of the HDMI ports 446, the bottom side of each of the HDMI ports 446 can be mechanically secured to the circuit board 470, whereas the top side and/or one or more remaining sides of each HDMI port can be mechanically secured by recesses in the heat sink 472.

The ports 441 may also include a USB port 442, a power input jack 444, an external infrared light blaster connection port 448 (e.g., IR light sensor input or output jack, etc.), an Ethernet port 449, and the like. The power input jack 444 and the external infrared light blaster connection port 448 are a first stacked connector and the USB port 442 and the Ethernet port 449 are a second stacked connector. Each of the stacked connectors can be made of plastic. The bottom of each stacked connector can be mechanically attached to the circuit board 470. Here also, to protect against momentum, the heat sink 372 surround the connectors to help with mechanically securing them.

Figure 5:
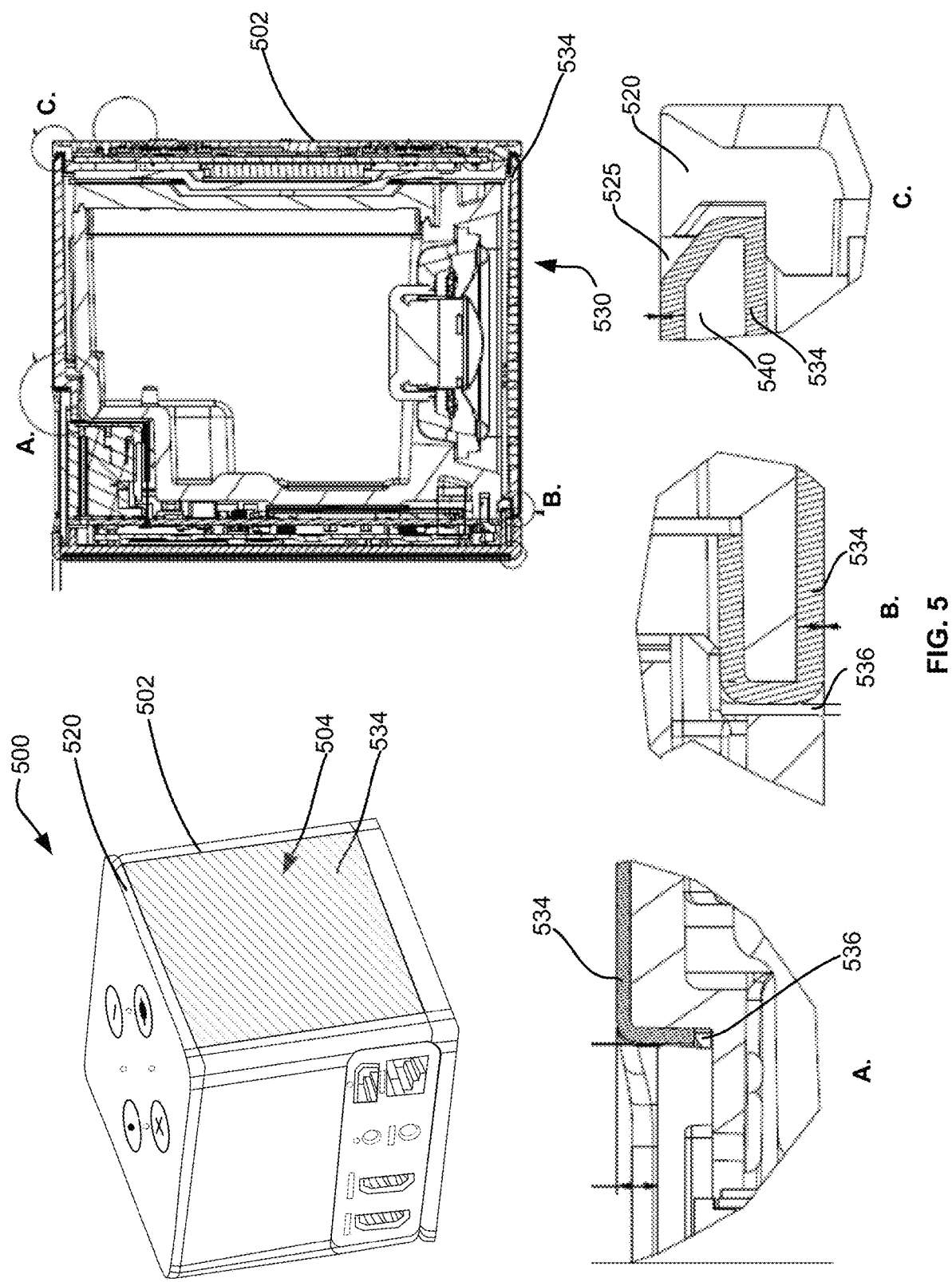
FIG. 5 illustrates various views of a fabric material of a multimedia streaming device according to some embodiments.

FIG. 5 illustrates various views of a fabric material 534 of a multimedia streaming device 500 according to some embodiments. The fabric material 534 can be positioned on an outer surface of a sidewall 504 of the housing 502. The fabric material 534 can also wrap around other sidewalls of the housing 502, such as front side 530 and rear side 540. The fabric material 534 can wrap around a top end of the sidewalls to be received in a chamfered recess 525 of a light waveguide 520 of the multimedia streaming device 500, which is shown in section C and further illustrated in FIG. 7. As shown in A and B, along with wrapping around the top ends of the sidewalls, the fabric material 534 can be received in gaps 536 between components of the multimedia streaming device 500. Wrapping the fabric material 534 into the gaps 536 can ensure that there are no visible light leaks in the housing 502.

FIG. 6 illustrates views of a top portion of a multimedia streaming device 600 according to some embodiments. A top surface 606, which can be a user-facing surface, of a housing 602 of the multimedia streaming device 600 includes various control buttons and microphone holes 618. The control buttons include volume control buttons 612, an action button 614, and a mute button 616. The action button 614 may cause, for instance, content to be paused or played among other actions (e.g., a long press of the action button 614 can result in powering off the multimedia steaming device 600). The microphone holes 618 can facilitate detection of ambient sound by microphones 662 positioned within the housing 602. There may be one microphone hole 618 per microphone 662, or there may be a different number of microphone holes 618 than microphones 662.

An internal component assembly 608 of the multimedia streaming device 600 under the top surface 606 includes a circuit board 660 on which the control buttons and the microphones 662 are installed. The volume control buttons 612, action button 614, and mute button 616 can be surrounded by a first seal 661, and the microphones 662 can be surrounded by a second seal 663 that is a separate piece from the first seal 661. The first seal 661 may surround each of the control buttons, whereas there may be a separate second seal 663 for each of the microphones 662. The second seal 663 can provide sound sealing for the microphones 662. The first seal 661 and the second seal 663 may be made of a same material or a different material. For instance, the first seal 661 may be made of a first rubber material and the second seal 663 may be made of a second rubber material.

Figure 7:
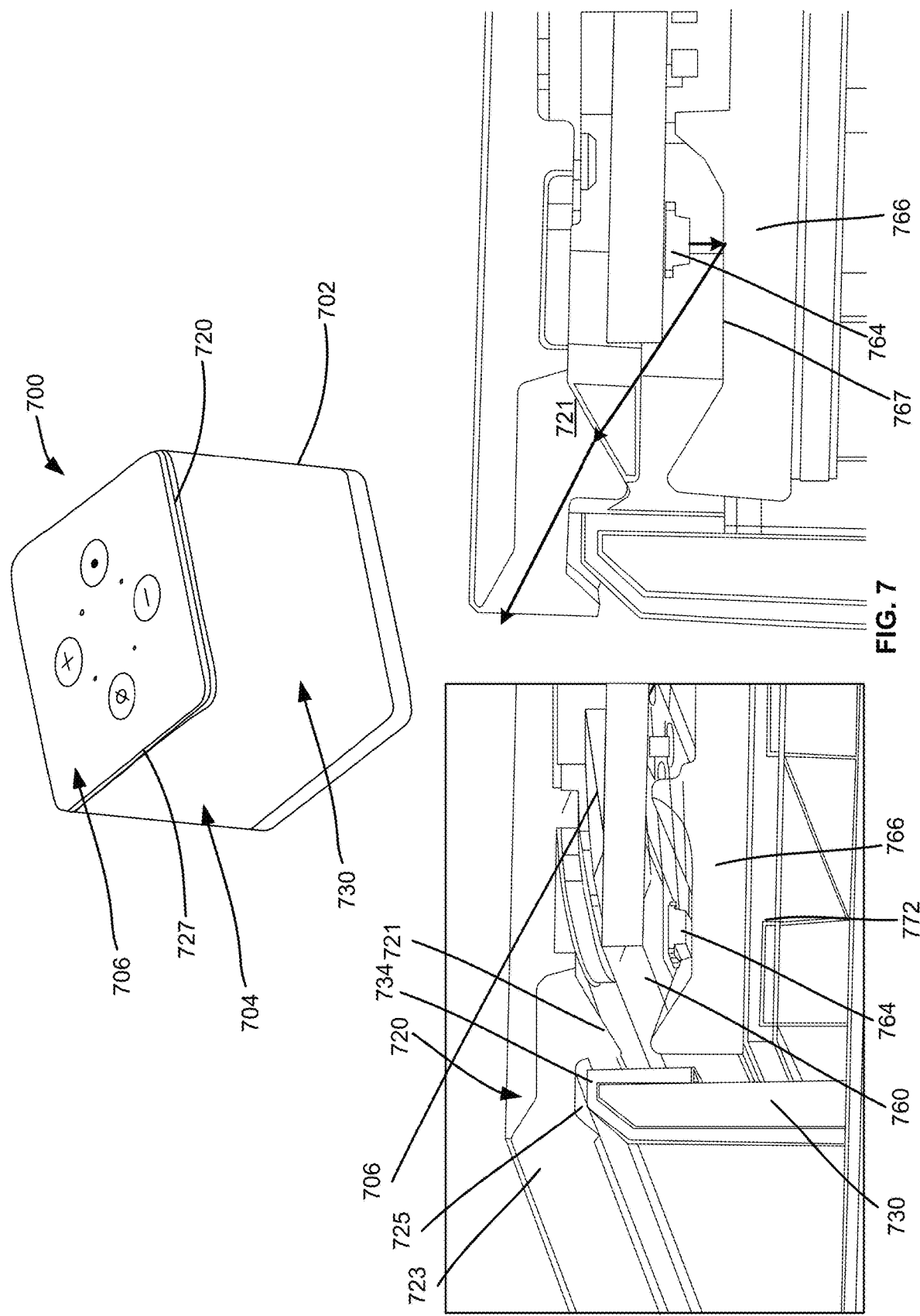
FIG. 7 illustrates views of a light waveguide of a multimedia streaming device according to some embodiments.

FIG. 7 illustrates views of a light waveguide 720 of a multimedia streaming device 700 according to some embodiments. The light waveguide 720 can be positioned at a top end of one sidewall of the housing 702. For instance, the light waveguide 720 may be positioned at the top end of front side 730, which may be parallel to a base area of a cone of a speaker of the multimedia streaming device 700. The light waveguide 720 includes a light emitting surface 723 and a light receiving surface 721. The light emitting surface 723 is positioned under a top surface 706 of the housing 702 and above the front side 730. The light receiving surface 721 is at an angle relative to the top surface 706. A geometry of the light waveguide 720 can be defined to match a geometry of the top end of the front side 730 of the housing 702. For instance, a bottom edge of the light waveguide 720 may be chamfered, such that the geometry includes multiple curvatures that match a geometry of the top end of the front side 730.

In an example, other sidewalls of the housing 702 may not include the light waveguide 720. Instead, the other sidewalls may include a light blocking material 727 at top ends of the other sidewalls, such as sidewall 704, that is in contact with a side end of the light waveguide 720. The light blocking material 727 can have the same geometry as the light waveguide 720 and define one or more non-light emitting surfaces. The light blocking material 727 can block light from being emitted at sidewalls other than the front side 730.

The light waveguide 720 also includes a recess 725 that receives the top end of the front side 730. In addition, the recess 725 receives a fabric material 734 that is on an outside surface of the front side 730 and wraps around the top end of the front side 730. The recess 725 may be a chamfered recess that matches the geometry of the bottom edge of the light waveguide 720. The light blocking material 727 can also include a similar recess for receiving top ends of the other sidewalls and the fabric material 734 that is on an outside surface of the other sidewalls.

In an example, the multimedia streaming device 700 includes a light source 764 installed on a circuit board 760, which is an example of the first circuit board 360 in FIG. 3. The light source 764 is positioned between the circuit board 760 and a top portion of a heat sink 772. The light source 764 may be a set of LEDs configured to emit human-visible light through the walls of the housing 702. Accordingly, light emitted by the light source 764 may be visible through the light waveguide 720. Light emitted by the light source 764 is incident on a reflector 766 that surrounds the light source 764 and is configured to reflect the light towards the light receiving surface 721 of the light waveguide 720. The reflector 766 includes a light reflection surface 767 under the light source 764 and parallel to the top surface 706. The light reflection surface 767 may be a mirror, a polished light reflection surface, or any other suitable reflection material. Upon the light reaching the light receiving surface 721, the light travels through the light waveguide 720 and is emitted outwardly by the light emitting surface 723.

FIG. 8 illustrates views of a heat sink 872 of a multimedia streaming device 800 according to some embodiments. The heat sink 872 is positioned within a housing 802 of the multimedia streaming device 800. The heat sink 872 defines a speaker enclosure and is positioned between a first circuit board 860 and a second circuit board 870. The heat sink 872 includes a top portion 876 that is in contact with the first circuit board 860 and a bottom portion 877 that is in contact with the second circuit board 870. Between the top portion 876 and the bottom portion 877, the heat sink 872 includes sidewalls, such as front sidewall 874 and sidewall 873, with the two sidewalls 873 and 874 extending along intersecting a plane and sharing an edge. The sidewalls may be in contact with an inner surface of sidewalls of the housing 802 to dissipate heat generated by at least the second circuit board 870 through fabric on an outside surface of the sidewalls of the housing 802. A speaker 875 can be installed in the front sidewall 874 of the heat sink 872 (e.g., in an opening defined in the front sidewall 874). The front sidewall 874 can be parallel to a front side 830 of the housing 802. That is, the front side 830 can be parallel to a base area of a cone of the speaker 875. The sidewalls of the heat sink 872 can be similar in size to the sidewalls of the housing 802. So, the sidewalls of the heat sink 872 may only be slightly smaller than the sidewalls of the housing 802, providing for efficient heat dissipation. In addition, due to the large size of the heat sink 872, the speaker 875 can also be large enough to take up a majority of the front sidewall 874.

In an example, the top portion 876 may be made of a different material than a remainder of the heat sink 872. For instance, the top portion 876 may be made out of a thermal insulation material, such as a plastic material, whereas the remainder of the heat sink 872 can be made out of a thermal conductor material, such as a metal material. The remainder of the heat sink 872 can be made out of diecast aluminum, and the top portion 876 can be secured thereto with epoxy, tight fitting, and/or other securing mechanism. The top portion 876 can provide separation between the thermal conductor material and antenna(e) 879 of an RF chain of the multimedia streaming device 800. The antenna(e) 879 may be RF antenna(e) that are installed on a user-facing surface of the first circuit board 860. As illustrated, the multimedia streaming device 800 may include three antennae 879. Two of the antennae 879 may be for WiFi and one of the antennae 879 may be for Bluetooth.

In an example, the multimedia streaming device 800 can also include a second heat sink 878 on a bottom surface of the second circuit board 870. The second heat sink 878 can provide supplementary heat dissipation in addition to the heat sink 872. However, the second heat sink 878 is optional and may not be included in the multimedia streaming device 800.

Figure 9:
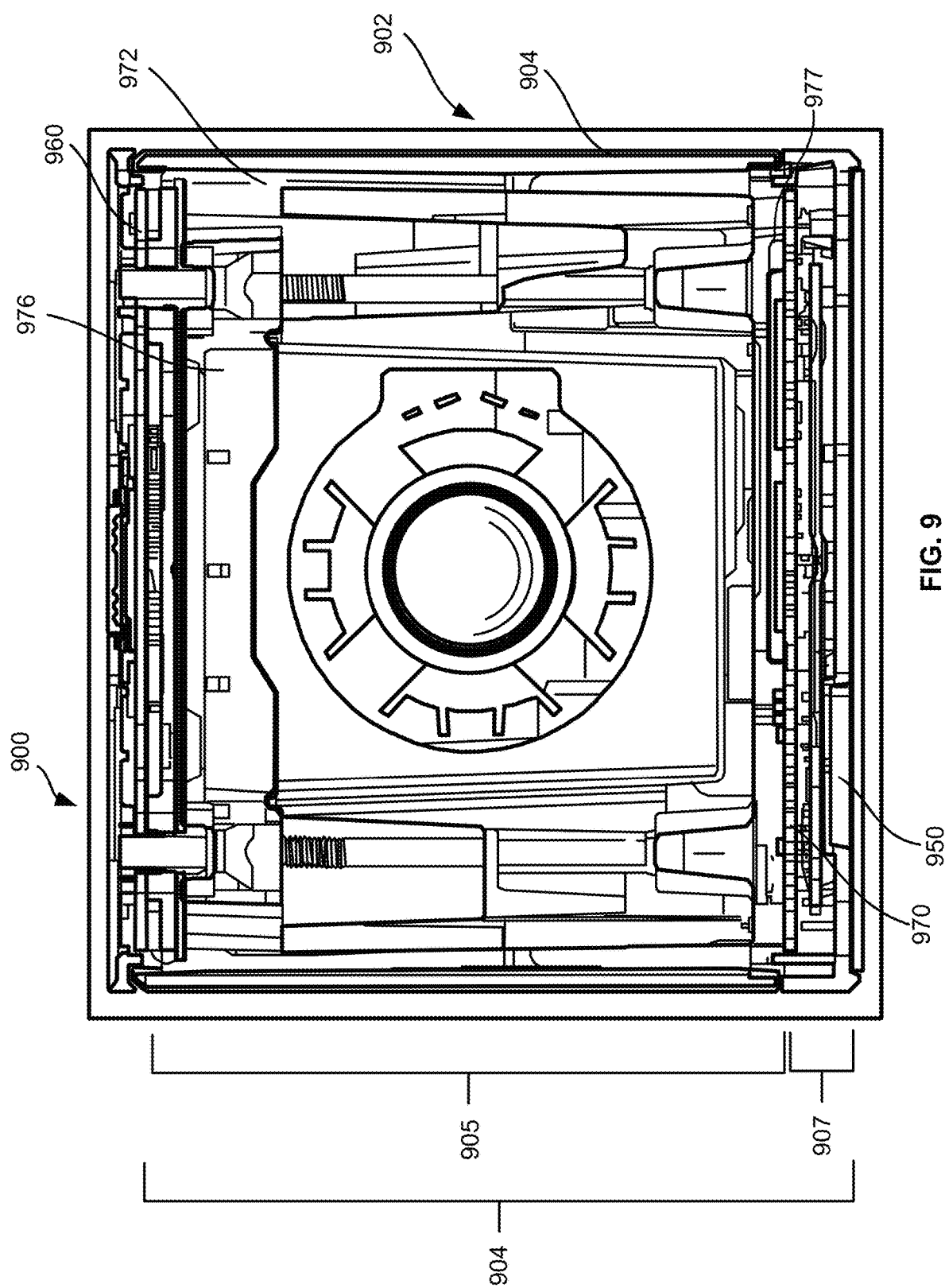
FIG. 9 illustrates an example of a top portion of a heat sink of a multimedia streaming device according to some embodiments.

FIG. 9 illustrates an example of a front view of a multimedia streaming device 900 according to some embodiments. The multimedia streaming device 900 includes a housing 902 with a top surface (not shown), sidewalls 904, and a bottom surface 950. Each of the top surface, sidewalls 904, and bottom surface 950 can be substantially rectangular, or square, in shape. The sidewalls 904 can include a first portion 907 that is IR transmissive and a second portion 905 that is IR non-transmissive. Under the top surface, the multimedia streaming device 900 includes control buttons and microphones installed on a first circuit board 960.

In an example, under the first circuit board 960 is a heat sink 972, of which a top portion 976 is in contact with the first circuit board 960 and is made of a thermal insulation material. Sidewalls and a bottom portion 977 of the heat sink 972 can be made of a metal material. An end of the top portion 976 of the heat sink 972 can extend under the first circuit board 960 where an RF antenna (e.g., RF antenna 879 in FIG. 8) is installed. The top portion 976 can also extend over a top end of a sidewall of the heat sink 972. The end of the top portion 976 that extends under the first circuit board 960 can have a thickness equal to or larger than a thickness threshold associated with coupling reduction between the RF antenna and metal material of a remaining portion of the heat sink 972. The coupling reduction can reduce interference and/or providing shielding to the RF antenna from metallic portions of the heat sink 972. For instance, the thickness threshold may be fifteen mm, so the top portion 976 can have a thickness of at least fifteen mm at the end that extends under the first circuit board 960 where an antenna is installed. Areas where the top portion 976 does not extend under the first circuit board 960 where an antenna is installed can be thinner.

The bottom portion 977 of the heat sink 972 can be in contact with the second circuit board 970. So, as the second circuit board 970 generates heat, the heat sink 972 can dissipate the heat. An IR transceiver (shown in FIG. 10) can be installed on the second circuit board 970. The IR transceiver is installed closer to the first portion 907 of the sidewalls 904 than the second portion 905 of the sidewalls 904. The bottom surface 950 of the housing 902 is positioned under the second circuit board 970 and under the first portion 907 of the sidewalls 904.

FIG. 10 illustrates an example of IR transmission of a multimedia streaming device according to some embodiments. Sidewalls 1004 of the multimedia streaming device include a first portion 1007 that is IR transmissive and a second portion 1005 that is IR non-transmissive. The first portion 1007 can include a wedge 1082 for directing IR emissions.

In an example, an IR transceiver 1080 is installed on a circuit board 1070 (e.g., the second circuit board 370 in FIG. 3) closer to the first portion 1007 than the second portion 1005. The IR transceiver 1080 can send and receive IR light emissions. For instance, the IR transceiver may receive IR light emissions 1084 from a remote control device that is associated with the multimedia streaming device. The wedge 1082 can direct incoming IR light emissions 1084 inwardly to the IR transceiver 1080. In addition, the wedge 1082 can diffuse outgoing IR light emissions 1086 outwardly from the sidewall 1004. The wedge 1082 can be configured as an IR waveguide that converge and direct inwardly the incoming IR light emissions 1084 and that diverge and direct outwardly the outgoing IR light emissions 1086. For instance, walls of the wedge 1082 may be made of out of IR transmissive material and shaped to have at least one angled wall relative to a bottom surface, or more generally, to have a triangular shape.

The multimedia streaming device may include multiple IR transceivers 1080 distributed around a bottom portion of the multimedia streaming device. One sidewall, such as a rear side, of the multimedia streaming device may be devoid of any IR transceivers so that the IR transceivers do not interfere with ports or connectors of the multimedia streaming device. In addition, the first portion 1007 can include a wedge 1082 in an area associated with each IR transceiver 1080 such that a wedge 1082 is positioned in front of and/or nearby each IR transceiver 1080.

Figure 11:
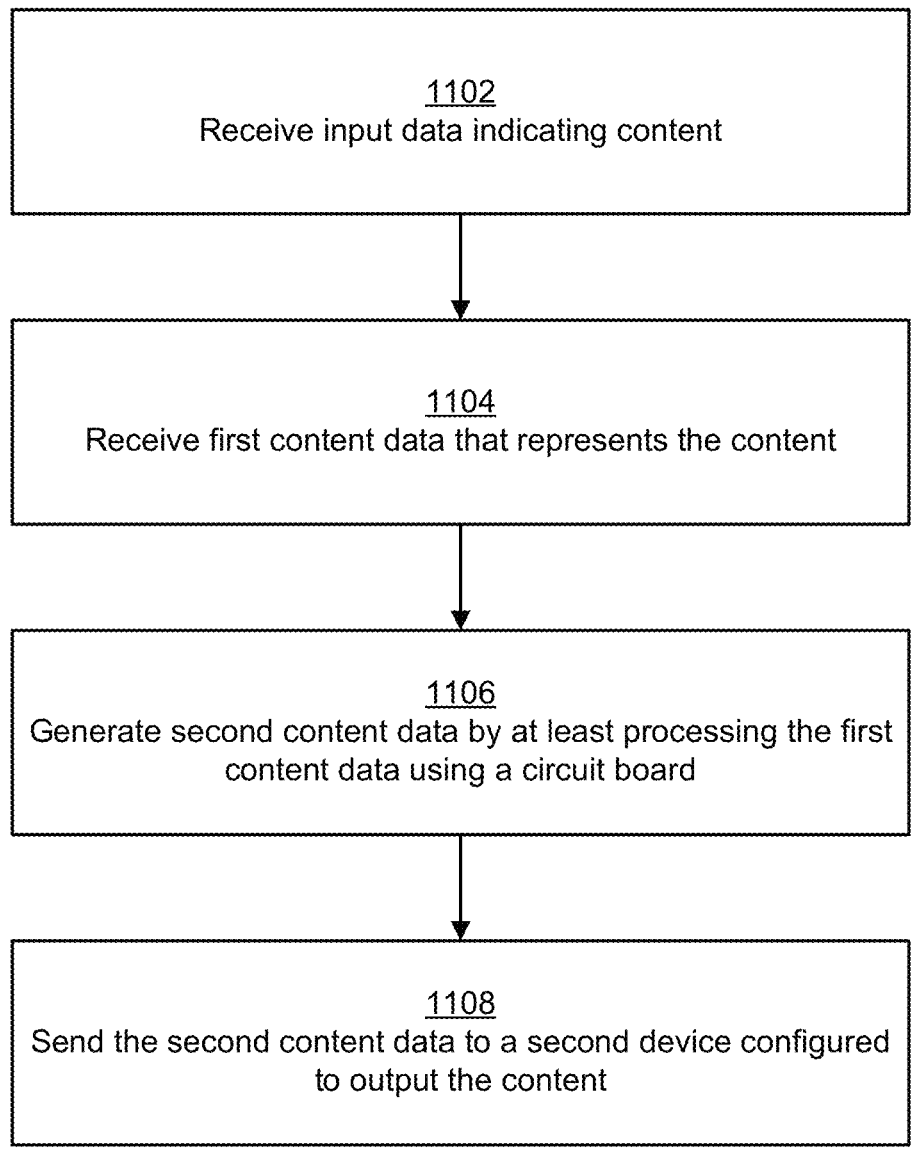
FIG. 11 illustrates an example flow for a process of streaming content using a multimedia streaming device according to some embodiments.

FIG. 11 illustrates an example flow for a process of streaming content using a multimedia streaming device according to some embodiments. Some or all of the process described in FIG. 11 (or any other processes described herein, or variations, and/or combinations thereof) may be performed under the control of the multimedia streaming device configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. The multimedia streaming device may include one or more circuit boards, such as first circuit board 360 and/or second circuit board 370 in FIG. 3, that includes the one or more processors for executing the instructions.

In an example, the flow includes operation 1102, where the multimedia streaming device receives input data indicating content. The multimedia streaming device is a first device that includes a first circuit board configured to receive the input data, a second circuit board electrically coupled to the first circuit board and configured to provide content processing, a heat sink, and a speaker. The heat sink is positioned between the first circuit board and the second circuit board and defines a speaker enclosure. The speaker enclosure includes a first portion (e.g., a top portion) in contact with the first circuit board, a second portion (e.g., a bottom portion) in contact with the second circuit board, and a third portion (e.g., sidewalls). The speaker is installed in the third portion of the speaker enclosure.

The input data may be audio data generated by a microphone of the multimedia streaming device. The microphone can be installed on the first circuit board. The audio data can correspond to a natural language utterance requesting content. An utterance usually begins with a wakeword, e.g., "Alexa" that upon detection by the multimedia streaming device (e.g., based on processing by the first circuit board and/or the second circuit board), indicates to the multimedia streaming device that a user voice command will be forthcoming. For example, user utterances can be statements that communicate a user's intent to hear audio content, such as "Alexa, play some jazz music." In other examples, user utterances can be statements that communication a user's intent to view video content, such as "Alexa, show me a comedy movie." The multimedia streaming device may output, by the speaker, other audio data that corresponds to a response to the natural language utterance. While the input data is being received and/or the other audio data is being output, a light emitting surface of a light waveguide on a sidewall of a housing of the multimedia streaming device can emit light. The multimedia streaming device can also include a non-light emitting surface that extends from the light emitting surface and that is on a second sidewall of the housing. Upon detecting the wakeword, the multimedia streaming device can further process the input data locally, send such data to a remoter server computer for processing thereat, or distributedly process the input data between the multimedia streaming device and the remote server computer to determine the specific content that is requested and a network address for a content source from which the requested content is available. The local processing can be implemented on the first circuit board and/or the second circuit board.

In an example, the flow includes operation 1104, where the multimedia streaming device receives first content data that represents the content. The first content data can be received from the content source, such as a remote server computer, in response to a request for the content from the multimedia streaming device. The request can use the network address of the content. Sending the request and receiving the first content data can be via an RF chain mounted to the first circuit board. Such received content data can be passed to the second circuit board from the first circuit board for further processing.

In an example, the flow includes operation 1106, where the multimedia streaming device generates second content data by at least processing the first content data using a circuit board. For instance, the second circuit board can implement a codec in the processing of the first content data, among other content processing functionalities. The second circuit board may emit heat while it processes the first content data and generates the second content data. The emitted heat can be received by the second portion of the speaker enclosure and then dissipated by the third portion of the speaker enclosure.

In an example, the flow includes operation 1108, where the multimedia streaming device sends the second content data to a second device configured to output the content. The second device may be an audio or video system capable of outputting the content. For instance, if a user requests audio content, the second device may be a speaker device. Alternatively, if the user requests video content, the second device may be a television. Upon receiving the second content data, the second device can output the content indicated by the second content data. The second content data can be sent via one or more AV ports of the multimedia streaming device.

FIG. 12 is a schematic block diagram of a multimedia streaming device 1200 in accordance with one or more example embodiments of the disclosure. The multimedia streaming device 1200 is an example of any of the multimedia streaming devices described herein above and may include any suitable computing device including, but not limited to, a server system, a mobile device such as a smartphone, a tablet, an e-reader, a wearable device, or the like; a desktop computer; a laptop computer; a content streaming device; a set-top box; a scanning device; a barcode scanning wand; or the like.

The multimedia streaming device 1200 may be configured to communicate with one or more servers, user devices, or the like. The multimedia streaming device 1200 may be configured to determine voice commands, determine wakeword utterances, determine and/or control other devices, and other operations. The multimedia streaming device 1200 may be configured to emit light, detect sound, output digital content, and other functionality. In some embodiments, a single remote server or a single group of remote servers may be configured to perform more than one type of functionality in conjunction with a barcode scanning device.

The multimedia streaming device 1200 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fibercoaxial (HFC) medium, a microwave medium, a radio frequency communication medium, a satellite communication medium, or any combination thereof.

In an illustrative configuration, the multimedia streaming device 1200 may include one or more, one or more memory devices 1204 (also referred to herein as memory 1204), one or more input/output (I/O) interface(s) 1206, one or more network interface(s) 1208, one or more sensor(s) or sensor interface(s) 1210, one or more transceiver(s) 1212, one or more optional camera(s) 1214, one or more optional microphone(s) 1216, and data storage 1220. The multimedia streaming device 1200 may further include one or more bus(es) 1218 that functionally couple various components of the multimedia streaming device 1200. The multimedia streaming device 1200 may further include one or more antenna(e) 1234 that may include, without limitation, a cellular antenna for transmitting or receiving signals to/from a cellular network infrastructure, an antenna for transmitting or receiving WiFi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 1218 may include at least one of a system bus, a memory bus, an address bus, or a message bus, and may permit the exchange of information (e.g., data (including computer-executable code), signaling, etc.) between various components of the multimedia streaming device 1200. The bus(es) 1218 may include, without limitation, a memory bus or a memory controller, a peripheral bus, an accelerated graphics port, and so forth. The bus(es) 1218 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 1204 of the multimedia streaming device 1200 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 1204 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 1204 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 1220 may include removable storage and/or non-removable storage including, but not limited to, magnetic storage, optical disk storage, and/or tape storage. The data storage 1220 may provide non-volatile storage of computer-executable instructions and other data. The memory 1204 and the data storage 1220, removable and/or non-removable, are examples of computer-readable storage media (CRSM) as that term is used herein.

The data storage 1220 may store computer-executable code, instructions, or the like that may be loadable into the memory 1204 and executable by the processor(s) 1202 to cause the processor(s) 1202 to perform or initiate various operations. The data storage 1220 may additionally store data that may be copied to the memory 1204 for use by the processor(s) 1202 during the execution of the computer-executable instructions. Moreover, output data generated as a result of execution of the computer-executable instructions by the processor(s) 1202 may be stored initially in the memory 1204 and may ultimately be copied to the data storage 1220 for non-volatile storage.

More specifically, the data storage 1220 may store one or more operating systems (O/S) 1222; one or more database management systems (DBMS) 1224; and one or more program module(s), applications, engines, computer-executable code, scripts, or the like such as, for example, one or more sound detection module(s) 1226, one or more communication module(s) 1228, one or more light bar control module(s) 1230, and/or one or more remote control module(s) 1232. Some or all of these module(s) may be sub-module(s). Any of the components depicted as being stored in the data storage 1220 may include any combination of software, firmware, and/or hardware. The software and/or firmware may include computer executable code, instructions, or the like that may be loaded into the memory 1204 for execution by one or more of the processor(s) 1202. Any of the components depicted as being stored in the data storage 1220 may support functionality described in reference to corresponding components named earlier in this disclosure.

The data storage 1220 may further store various types of data utilized by the components of the multimedia streaming device 1200. Any data stored in the data storage 1220 may be loaded into the memory 1204 for use by the processor(s) 1202 in executing computer-executable code. In addition, any data depicted as being stored in the data storage 1220 may potentially be stored in one or more datastore(s) and may be accessed via the DBMS 1224 and loaded in the memory 1204 for use by the processor(s) 1202 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like. In FIG. 12, an example datastore(s) may include, for example, historical data for previously identified products, purchase or order history, user profile information, and/or other information.

The processor(s) 1202 may be configured to access the memory 1204 and execute the computer-executable instructions loaded therein. For example, the processor(s) 1202 may be configured to execute the computer-executable instructions of the various program module(s), applications, engines, or the like of the multimedia streaming device 1200 to cause or facilitate various operations to be performed in accordance with one or more embodiments of the disclosure. The processor(s) 1202 may include any suitable processing unit capable of accepting data as input, processing the input data in accordance with stored computer-executable instructions, and generating output data. The processor(s) 1202 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 1202 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 1202 may be capable of supporting any of a variety of instruction sets.

Referring now to functionality supported by the various program module(s) depicted in FIG. 12, the sound detection module(s) 1226 may include computer-executable instructions, code, or the like that responsive to execution by one or more of the processor(s) 1202 may perform functions including, but not limited to, detect sound, determine sound meanings, generate audio signals and audio data, determine a location of sound, and the like.

The communication module(s) 1228 may include computer-executable instructions, code, or the like that responsive to execution by one or more of the processor(s) 1202 may perform functions including, but not limited to, sending and/or receiving data, including content, sending and/or receiving instructions and commands, and the like. The light bar control module(s) 1230 may include computer-executable instructions, code, or the like that responsive to execution by one or more of the processor(s) 1202 may perform functions including, but not limited to, determining a light bar illumination status, determining which LEDs to illuminate, causing a change in illumination status, and the like.

The remote control module(s) 1232 may include computer-executable instructions, code, or the like that responsive to execution by one or more of the processor(s) 1202 may perform functions including, but not limited to, controlling other electronic devices, sending infrared signals, sending or outputting digital audio or video signals, and the like.

Referring now to other illustrative components depicted as being stored in the data storage 1220, the O/S 1222 may be loaded from the data storage 1220 into the memory 1204 and may provide an interface between other application software executing on the multimedia streaming device 1200 and the hardware resources of the multimedia streaming device 1200. More specifically, the O/S 1222 may include a set of computer-executable instructions for managing the hardware resources of the multimedia streaming device 1200 and for providing common services to other application programs (e.g., managing memory allocation among various application programs). In certain example embodiments, the O/S 1222 may control execution of the other program module(s). The O/S 1222 may include any operating system now known or which may be developed in the future including, but not limited to, any server operating system, any mainframe operating system, or any other proprietary or non-proprietary operating system.

The DBMS 1224 may be loaded into the memory 1204 and may support functionality for accessing, retrieving, storing, and/or manipulating data stored in the memory 1204 and/or data stored in the data storage 1220. The DBMS 1224 may use any of a variety of database models (e.g., relational model, object model, etc.) and may support any of a variety of query languages. The DBMS 1224 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the multimedia streaming device 1200 is a mobile device, the DBMS 1224 may be any suitable lightweight DBMS optimized for performance on a mobile device.

Referring now to other illustrative components of the multimedia streaming device 1200, the input/output (I/O) interface(s) 1206 may facilitate the receipt of input information by the multimedia streaming device 1200 from one or more I/O devices as well as the output of information from the multimedia streaming device 1200 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the multimedia streaming device 1200 or may be separate. The I/O devices may further include, for example, any number of peripheral devices such as data storage devices, printing devices, and so forth.

The I/O interface(s) 1206 may also include an interface for an external peripheral device connection such as universal serial bus (USB), FireWire, Thunderbolt, Ethernet port or other connection protocol that may connect to one or more networks. The I/O interface(s) 1206 may also include a connection to one or more of the antenna(e) 1234 to connect to one or more networks via a wireless local area network (WLAN) (such as WiFi radio, Bluetooth, ZigBee, and/or a wireless network radio), and/or a radio capable of communication with a wireless communication network (such as a Long Term Evolution (LTE) network, WiMAX network, 4G network, a 5G network, a ZigBee network, etc.).

The multimedia streaming device 1200 may further include one or more network interface(s) 1208 via which the multimedia streaming device 1200 may communicate with any of a variety of other systems, platforms, networks, devices, and so forth. The network interface(s) 1208 may enable communication, for example, with one or more wireless routers, one or more host servers, one or more web servers, and the like via one or more networks.

The antenna(e) 1234 may include any suitable type of antenna depending, for example, on the communications protocols used to transmit or receive signals via the antenna (e) 1234. Non-limiting examples of suitable antennae may include directional antennae, non-directional antennae, dipole antennae, folded dipole antennae, patch antennae, multiple-input multiple-output (MIMO) antennae, or the like. The antenna(e) 1234 may be communicatively coupled to one or more transceiver(s) 1212 or radio components to which or from which signals may be transmitted or received.

The antenna(e) 1234 may include a cellular antenna configured to transmit or receive signals in accordance with established standards and protocols, such as Global System for Mobile Communications (GSM), 4G standards (e.g., Long-Term Evolution (LTE), WiMax, etc.), 5G standards, direct satellite communications, or the like.

The antenna(e) 1234 may additionally, or alternatively, include a WiFi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 1234 may be configured to transmit or receive radio frequency signals within any suitable frequency range forming part of the unlicensed portion of the radio spectrum.

The antenna(e) 1234 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 1212 may include any suitable radio component(s) for—in cooperation with the antenna(e) 1234—transmitting or receiving radio frequency (RF) signals in the bandwidth and/or channels corresponding to the communications protocols utilized by the multimedia streaming device 1200 to communicate with other devices. The transceiver(s) 1212 may include hardware, software, and/or firmware for modulating, transmitting, or receiving—potentially in cooperation with any of antenna(e) 1234—communications signals according to any of the communications protocols discussed above including, but not limited to, one or more WiFi and/or WiFi direct protocols, as standardized by the IEEE 802.11 standards, one or more non-WiFi protocols, or one or more cellular communications protocols or standards. The transceiver(s) 1212 may further include hardware, firmware, or software for receiving GNSS signals. The transceiver(s) 1212 may include any known receiver and baseband suitable for communicating via the communications protocols utilized by the multimedia streaming device 1200. The transceiver(s) 1212 may further include a low noise amplifier (LNA), additional signal amplifiers, an analog-to-digital (AID) converter, one or more buffers, a digital baseband, or the like.

The sensor(s)/sensor interface(s) 1210 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The camera(s) 1214 may be any device configured to capture ambient light or images. The microphone(s) 1216 may be any device configured to receive analog sound input or voice data.

It should be appreciated that the program module(s), applications, computer-executable instructions, code, or the like depicted in FIG. 12 as being stored in the data storage 1220 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the multimedia streaming device 1200, and/or hosted on other computing device(s) accessible via one or more networks, may be provided to support functionality provided by the program module(s), applications, or computer-executable code depicted in FIG. 12 and/or additional or alternate functionality. Further, functionality may be modularized differently such that processing described as being supported collectively by the collection of program module(s) depicted in FIG. 12 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 12 may be implemented, at least partially, in hardware and/or firmware across any number of devices.

It should further be appreciated that the multimedia streaming device 1200 may include alternate and/or additional hardware, software, or firmware components beyond those described or depicted without departing from the scope of the disclosure. More particularly, it should be appreciated that software, firmware, or hardware components depicted as forming part of the multimedia streaming device 1200 are merely illustrative and that some components may not be present or additional components may be provided in various embodiments. While various illustrative program module(s) have been depicted and described as software module(s) stored in the data storage 1220, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as submodule(s) of other module(s).

One or more operations of the method, process flow, and use case of FIG. 11 may be performed by a device having the illustrative configuration depicted in FIG. 12, or more specifically, by one or more engines, program module(s), applications, or the like executable on such a device. It should be appreciated, however, that such operations may be implemented in connection with numerous other device configurations. Further, some or all of the components 1202-1234 of the multimedia streaming device 1200 may be distributed between multiple circuit boards, separated by a heat sink as described in connection with FIGS. 1-10.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A multimedia streaming device comprising:
a housing;
a first circuit board within the housing, the first circuit board positioned under a top surface of the housing;

a second circuit board within the housing, the second circuit board electrically coupled with the first circuit board and positioned over a bottom surface of the housing;

a heat sink within the housing, the heat sink positioned between the first circuit board and the second circuit board, the heat sink defining a speaker enclosure that includes a top portion in contact with the first circuit board, a bottom portion in contact with the second circuit board and opposite to the top portion, and a plurality of sidewalls between the top portion and the bottom portion;

a speaker within the housing, the speaker installed in the speaker enclosure by being installed in a first sidewall of the plurality of sidewalls;

a plurality of ports within the housing and outside of the heat sink, the plurality of ports installed on the second circuit board under a second sidewall of the plurality of sidewalls, the second sidewall being opposite to the first sidewall;

a plurality of microphones installed on the first circuit board and under the top surface of the housing;

a plurality of control buttons installed on the first circuit board and under the top surface of the housing;

one or more processors installed on the second circuit board over the bottom surface of the housing; and one or more memory installed on the second circuit board over the bottom surface of the housing, the one or more memory storing instructions that, upon execution by the one or more processors, cause the one or more processors to receive, process, and send multimedia content data to a television coupled with the multimedia streaming device via at least one port of the plurality of ports.

2. The multimedia streaming device of claim 1 further comprising:
a light waveguide that comprises (i) a light emitting surface positioned under the top surface of the housing and a third sidewall of the housing parallel to the first sidewall of the speaker enclosure, and a (ii) a light receiving surface at an angle relative to the top surface;
a light source installed on the first circuit board and positioned between the first circuit board and the top portion of the heat sink; and
a reflector that surrounds the light source and comprises a light reflection surface under the light source and parallel to the top surface.

3. The multimedia streaming device of claim 2 further comprising:
a fabric material positioned on an outside surface of the third sidewall, wherein the fabric material wraps around a top end of the third sidewall and is received in a chamfered recess of the light waveguide.

4. A device assembly comprising:
a first circuit board configured to provide user controls;
a second circuit board electrically coupled with the first circuit board and configured to provide content processing;
a heat sink positioned between the first circuit board and the second circuit board and defining a speaker enclosure that includes a first portion in contact with the first circuit board, a second portion in contact with the second circuit board, and a third portion; and
a speaker installed in the third portion of the speaker enclosure.

5. The device assembly of claim 4, wherein the first portion is a top portion, the second portion is a bottom portion, and the third portion includes a plurality of sidewalls, and further comprising:
a housing;
a plurality of ports within the housing and outside of the heat sink, the plurality of ports installed on the second circuit board under a second sidewall of the plurality of sidewalls, the second sidewall being opposite to a first sidewall where the speaker is installed;
a plurality of microphones installed on the first circuit board and under a top surface of the housing;
a plurality of control buttons installed on the first circuit board and under the top surface of the housing;
one or more processors installed on the second circuit board over a bottom surface of the housing; and
one or more memory installed on the second circuit board over the bottom surface of the housing, the one or more memory storing instructions that, upon execution by the one or more processors, cause the one or more processors to receive, process, and send multimedia content data to a television coupled with the multimedia streaming device via at least one port of the plurality of ports.

6. The device assembly of claim 4 further comprising:
a plurality of audio/video (AV) ports and a connector, wherein the connector comprises at least two stacked input and/or output ports.

7. The device assembly of claim 6, wherein an AV port of the AV ports is High-Definition Multimedia Interface (HDMI) compliant and is installed on the second circuit board in a vertical orientation.

8. The device assembly of claim 7, wherein the AV port comprises a first pin and a second pin, wherein the first pin is closer than the second pin to the second circuit board and is shorter in length than the second pin.

9. The device assembly of claim 6, wherein the plurality of AV ports and the connector are installed on the second circuit board and are secured at least in part by the heat sink.

10. The device assembly of claim 4 further comprising:
a light waveguide that comprises a light emitting surface and a light receiving surface;
a light source installed on the first circuit board and positioned between the first circuit board and the first portion of the heat sink; and
a reflector that surrounds the light source and configured to reflect light emitted by the light source towards the light receiving surface.

11. The device assembly of claim 10 further comprising:
a housing comprising a plurality of sidewalls, wherein the light waveguide is positioned at a first top end of a first sidewall of the plurality of sidewalls and has a first geometry, wherein the first sidewall is parallel to a base area of a cone of the speaker; and
a light blocking material that is in contact with a side end of the light waveguide, is positioned at a second top end of a second sidewall of the plurality of sidewalls, and has the first geometry.

12. The device assembly of claim 10 further comprising:
a housing comprising a sidewall parallel to a base area of a cone of the speaker; and
a fabric material on an outside surface of the sidewall, wherein a portion of the fabric material wraps around an end of the sidewall, wherein the light waveguide comprises a recess that receives the end of the sidewall and the portion of the fabric material.

13. The device assembly of claim 4, wherein the first portion of the heat sink is made out of a thermal insulation material, and wherein the second portion and the third portion of the heat sink are made out of a thermal conductor material.

14. The device assembly of claim 13, wherein the third portion comprises a sidewall made out of a metal material, and further comprising:
a radio frequency (RF) antenna installed on the first circuit board, wherein an end of the first portion of the heat sink extends under the first circuit board where the RF antenna is installed and over a top end of the sidewall, and wherein the end of the first portion has a thickness equal to or larger than a thickness threshold associated with coupling reduction between the RF antenna and the metal material.

15. The device assembly of claim 14 further comprising:
a housing that comprises a sidewall, wherein a first portion of the sidewall is infrared (IR) transmissive and a second portion of the sidewall is IR non-transmissive; and
an IR transceiver within the housing, the IR transceiver installed on the second circuit board and being closer to the first portion of the sidewall than the second portion of the sidewall.

16. The device assembly of claim 15, wherein the first portion of the sidewall comprises a wedge configured to direct incoming IR emissions inwardly to the IR transceiver and to diffuse outgoing IR emissions outwardly from the sidewall.

17. The device assembly of claim 4 further comprising:
a control button installed on a user-facing surface of the first circuit board and surrounded by a first seal;
a microphone installed on the user-facing surface of the first circuit board and surrounded by a second seal, wherein the second seal is made of a same material or a different material than the first seal and is a separate piece from the first seal; and
an antenna installed on the user-facing surface of the first circuit board.

18. A method comprising:
receiving, by a first device, input data indicating content, wherein the first device comprises:
a first circuit board configured to receive the input data,
a second circuit board electrically coupled with the first circuit board and configured to provide content processing,
a heat sink positioned between the first circuit board and the second circuit board and defining a speaker enclosure that includes a first portion in contact with the first circuit board, a second portion in contact with the second circuit board, and a third portion, and
a speaker installed in the third portion of the speaker enclosure;
receiving, by the first device, first content data that represents the content;
generating, by the first device, second content data by at least processing the first content data using the second circuit board; and
sending, by the first device, the second content data to a second device configured to output the content.

19. The method of claim 18 further comprising:
generating, by a microphone of the first device, first audio data that corresponds to a natural language utterance requesting the content, wherein the input data comprises the first audio data;
outputting second audio data by the speaker, wherein the second audio data corresponds to a response to the natural language utterance; and
emitting, from a light emitting surface of a light waveguide of the first device, light while the second audio data is being output, wherein the light emitting surface is on a sidewall of a housing of the first device and has a first geometry, wherein the first device further comprises a non-light emitting surface that extends from the light emitting surface, is on a second sidewall of the housing, and has the first geometry.

20. The method of claim 18 further comprising:
receiving, by the second portion of the speaker enclosure, heat emitted by the second circuit board; and
dissipating, by the third portion of the speaker enclosure, the heat.

* * * * *